US008397860B2

(12) United States Patent
Rodgers

(10) Patent No.: US 8,397,860 B2
(45) Date of Patent: Mar. 19, 2013

(54) SPEAKER ENCLOSURE

(75) Inventor: Howard Rodgers, Calabasas, CA (US)

(73) Assignee: Rogersound Labs, LLC, Calabasas, CA (US)

( * ) Notice: Subject to any disclaimer, the term of this patent is extended or adjusted under 35 U.S.C. 154(b) by 0 days.

(21) Appl. No.: 13/595,184

(22) Filed: Aug. 27, 2012

(65) Prior Publication Data

US 2013/0043089 A1 Feb. 21, 2013

Related U.S. Application Data

(62) Division of application No. 13/214,003, filed on Aug. 19, 2011, now Pat. No. 8,256,566.

(51) Int. Cl.
*H05K 5/00* (2006.01)
*H04R 1/02* (2006.01)

(52) U.S. Cl. ........ 181/156; 181/144; 181/146; 181/152; 381/335; 381/345; 381/346; 381/386

(58) Field of Classification Search .................. 181/156, 181/152, 146, 144; 381/386, 346, 345, 335
See application file for complete search history.

(56) References Cited

U.S. PATENT DOCUMENTS

| | | | | | |
|---|---|---|---|---|---|
| 2,751,997 | A * | 6/1956 | Gately, Jr. | 181/152 |
| 2,766,839 | A * | 10/1956 | Baruch et al. | 181/146 |
| 2,971,598 | A * | 2/1961 | Sieler | 181/152 |
| 2,986,229 | A * | 5/1961 | Perkins, Jr. | 181/199 |
| 3,112,006 | A * | 11/1963 | Roberts | 181/156 |
| 3,165,587 | A * | 1/1965 | Alderson | 381/335 |
| 3,186,509 | A * | 6/1965 | Dudognon | 181/155 |
| 3,327,808 | A * | 6/1967 | Shaper | 181/153 |
| 3,729,061 | A * | 4/1973 | Tamura | 181/146 |
| 3,892,288 | A * | 7/1975 | Klayman et al. | 181/156 |
| 4,064,966 | A * | 12/1977 | Burton | 181/144 |
| 4,122,302 | A * | 10/1978 | Bobb | 381/335 |
| 4,126,204 | A * | 11/1978 | Ogi et al. | 181/156 |
| 4,128,738 | A * | 12/1978 | Gallery | 381/335 |
| 4,524,846 | A * | 6/1985 | Whitby | 181/152 |
| 4,593,784 | A * | 6/1986 | Flanders | 181/144 |
| 4,611,686 | A * | 9/1986 | Kobayashi et al. | 181/156 |
| 4,837,837 | A * | 6/1989 | Taddeo | 381/346 |
| 4,853,964 | A * | 8/1989 | Weckler | 381/341 |
| 5,012,889 | A * | 5/1991 | Rodgers | 181/152 |
| 5,111,905 | A * | 5/1992 | Rodgers | 181/152 |
| 5,373,564 | A * | 12/1994 | Spear et al. | 381/352 |
| 5,514,841 | A * | 5/1996 | Rochon | 181/156 |
| 5,602,367 | A * | 2/1997 | Meyer | 181/156 |
| 5,647,012 | A * | 7/1997 | Han | 381/386 |
| 5,731,552 | A * | 3/1998 | Tsao | 181/156 |
| 5,809,154 | A * | 9/1998 | Polk | 381/345 |
| 5,821,471 | A * | 10/1998 | McCuller | 181/156 |
| 6,744,902 | B2 * | 6/2004 | Proni | 381/386 |
| 7,162,049 | B2 * | 1/2007 | Polk, Jr. | 381/345 |
| 7,269,270 | B2 * | 9/2007 | Freeman et al. | 381/346 |
| 8,064,627 | B2 * | 11/2011 | Maeshiba | 381/349 |
| 8,094,855 | B2 * | 1/2012 | Clements | 381/353 |

* cited by examiner

*Primary Examiner* — David Warren
*Assistant Examiner* — Christina Russell
(74) *Attorney, Agent, or Firm* — Blakely Sokoloff Taylor Zafman LLP

(57) ABSTRACT

A loudspeaker enclosure accommodates at least one speaker. Sound waves emanating from the rear of the speaker exit through a port in the enclosure. The interior of the enclosure contains at least one partition to lengthen the acoustic path from the rear of the speaker to the port and to cause alternating expansion and contraction of the sound waves emanating from the rear of the speaker. The partitions are arranged in relation to the speaker(s) so as to reduce sound wave reflections that would create non-linearities in the frequency response.

10 Claims, 9 Drawing Sheets

SPEAKER ENCLOSURE

CROSS-REFERENCE TO RELATED APPLICATION

This is a divisional application of co-pending application Ser. No. 13/214,003, filed Aug. 19, 2011.

BACKGROUND OF THE INVENTION

1. Field of the Invention

This invention relates to the field of loudspeaker systems, and more particularly to a high efficiency, extended bass speaker enclosure.

2. Background Art

This inventor's U.S. Pat. No. 5,012,889 describes a speaker enclosure that provided a significant improvement over then state-of-the-art loudspeaker systems. One of the objects of my earlier invention was to provide a speaker system that yielded a lower or deeper response from a given-sized enclosure over conventional methods of tuning. Another object of my earlier invention was the elimination of various unwanted side effects of conventional tuning methods. For example, the loudspeaker enclosure described in my earlier patent avoided the creation of standing waves, which degrade the speaker's performance, by reducing parallel surfaces inside the speaker enclosure.

The interior of the enclosure was divided into two smaller chambers by means of a partition inclined with respect to the front and rear walls. One such chamber was adjacent to the speaker, while the second or rear chamber was separated from the front chamber by the partition. Below the speaker, a vent or port allowed the rear chamber to communicate with the environment outside of the enclosure.

Sound waves emanating from the rear of the speaker were reflected by the inclined partition toward the top of the speaker enclosure. The partition did not extend all the way to the top wall of the enclosure, thereby allowing sound waves to reflect off of the top wall and enter the rear chamber. The sound waves then exited the enclosure through the port below the speaker. The rear waves were thus delayed with respect to the front waves from the speaker to achieve the desired tuning of the speaker system. Furthermore, the arrangement of the interior partition caused the rear waves to be compressed at two locations thereby increasing the effective delay and further improving low frequency response.

Another embodiment of a speaker enclosure employing these design principles is described in my subsequently issued U.S. Pat. No. 5,111,905. The disclosures of both U.S. Pat. No. 5,012,889 and U.S. Pat. No. 5,111,905 are fully incorporated herein by reference.

Although the speaker enclosures of my earlier patents provided improved bass performance for a given-sized enclosure in comparison to other speaker designs of the time, it was found that reflected sound waves would effectively cancel some of the frequencies of sound and create non-linearities in the frequency response.

SUMMARY OF THE INVENTION

Embodiments of the present invention comprise a loudspeaker enclosure accommodating at least one speaker. Sound waves emanating from the rear of the speaker exit through a port in the enclosure. The interior of the enclosure contains at least one partition to lengthen the acoustic path from the rear of the speaker to the port and to cause alternating expansion and contraction of the sound waves emanating from the rear of the speaker. The partitions are arranged in relation to the speaker(s) so as to reduce sound wave reflections that would create non-linearities in the frequency response.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION OF THE INVENTION

Figure 1:
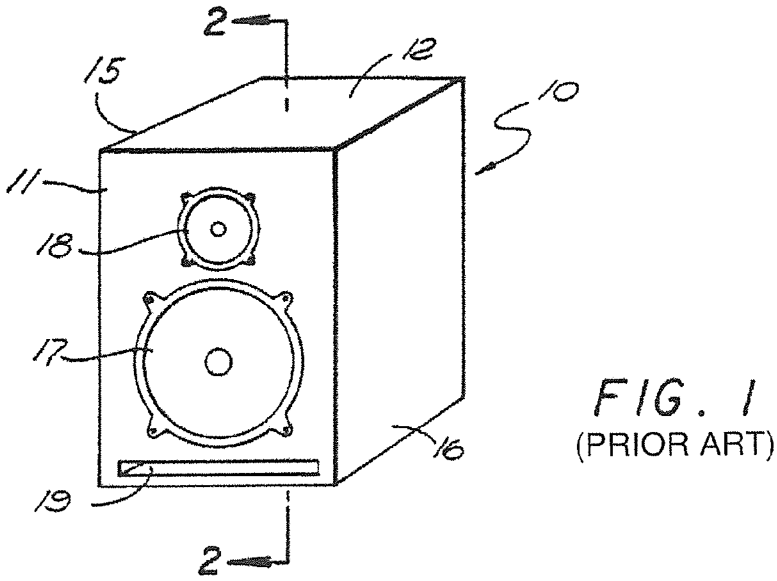
FIG. 1 (PRIOR ART)
FIG. 1 is a perspective view of a prior art loudspeaker system.

In the following description, for purposes of explanation and not limitation, specific numbers, dimensions, materials, etc. are set forth in order to provide a thorough understanding of the present invention. However, it will be apparent to one skilled in the art that the present invention may be practiced in other embodiments that depart from these specific details. In other instances, detailed descriptions of well-known speaker components are omitted so as not to obscure the description of the present invention with unnecessary detail.

Throughout this description, reference is made to relative directions, such as "top", "bottom", "front", "back", "side" and similar terms. It will be understood that these terms refer to directions as the speaker enclosures are illustrated in the drawings; however, this does not dictate the orientations in which the speaker enclosures may be utilized. For example, it may be convenient to place a speaker enclosure on its side so that the "side" of the enclosure as described herein is actually the "bottom" of the enclosure as used. Therefore, the use of such terms is not to be interpreted as limiting the invention in any regard.

Figure 2:
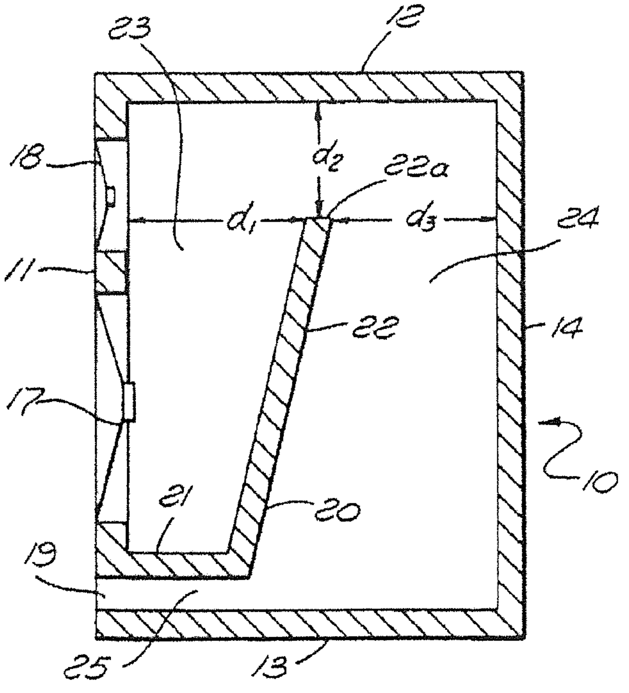
FIG. 2 (PRIOR ART)
FIG. 2 is a cross-sectional view through line 2-2 of FIG. 1.

Referring to FIGS. 1 and 2, the loudspeaker enclosure 10 of my earlier patents is shown. Enclosure 10 is a generally box-like structure having a front wall 11, a top wall 12, a bottom wall 13, a rear wall 14, and opposing side walls 15 and 16.

Loudspeakers 17 and 18 are mounted in respective apertures in front wall 11. As is conventional in the construction of multi-speaker systems, loudspeaker 17, also referred to as a woofer, is designed to reproduce bass frequencies, whereas loudspeaker 18 is designed to reproduce frequencies in the mid-range and above. A crossover network (not shown) separates the frequency components radiated by loudspeakers 17 and 18. Additional loudspeakers or other sound radiating devices may be incorporated in enclosure 10, either co-located on front wall 11 with loudspeakers 17 and 18 or disposed on one of the other walls of the enclosure. In particular, multiple woofers may be employed in lieu of a single speaker as illustrated. A grill of fabric, foam or other suitable material may be secured to the outer surface of front wall 11 in order to provide a pleasing and decorative appearance.

Referring particularly to FIG. 2, enclosure 10 includes a partition 20 disposed therewithin. Partition 20 includes a shelf portion 21 that is generally horizontal and that abuts front wall 11 immediately below woofer 17. Inclined portion 22 is contiguous with shelf portion 21 and extends upwardly and rearwardly therefrom behind woofer 17, terminating at top edge 22*a*. Both shelf portion 21 and inclined portion 22 extend the entire width of enclosure 10 between side walls 15 and 16. Shelf portion 21 and inclined portion 22 are secured to side walls 15 and 16 so that the interior volume of enclosure 10 is acoustically separated into a first chamber 23 adjacent to woofer 17 and a second chamber 24 between inclined portion 22 and rear wall 14. Shelf portion 21 is separated from bottom wall 13 by a narrow passage 25, which communicates with port 19. Port 19 comprises an aperture formed within front wall 11, or may be conveniently formed by terminating the lower portion of front wall 11 at shelf portion 21 so that a horizontal slot is formed adjacent to bottom wall 13 extending the entire width of enclosure 10 between side walls 15 and 16.

The above-described speaker system provided improved bass performance for a given-sized enclosure in comparison to contemporaneous speaker designs. However, a problem with this earlier design was that, in a smaller enclosure, the woofer 17 was necessarily placed near the bottom of the inclined portion 22. This meant that the inclined portion 22 was in close proximity to the back of the woofer. It was found that some of the sound waves would travel to the partition and reflect directly back towards the woofer. These reflected sound waves would effectively cancel some of the frequencies of sound and create non-linearities in the frequency response. Most often, this could be discerned in the midrange frequencies.

The cancellation frequency can be determined by measuring the distance from the rear of the woofer cone to the board and doubling it for the round trip. Then, the frequency for a half wavelength of this distance may be determined. At the distance of a half wavelength, the reflected sound from the board will reach the back of the woofer cone 180 degrees out of phase, with the result being partial cancellation. For example, at a distance of 2½ inches from the board, the frequency of cancellation will be approximately 1,350 HZ, which is clearly in the audible range. As the board is slanted, there will be additional frequencies that will be subject to this cancellation.

It should be noted that, for simplification purposes, reference is made to the sound wave that travels off the back of the woofer cone and into the enclosure. However, in reality for any given frequency, the sound travels in one direction for the first part or 180 degrees of the cycle and in the opposite direction for the second half or 180 degrees of the cycle. So, depending on the time and frequency, the sound wave may be traveling in either direction inside the enclosure.

The design of a speaker enclosure is driven by many considerations. The external dimensions, of course, must be large enough to accommodate the size(s) of the selected speaker(s), but it is generally desired to make the enclosure as compact as reasonably possible. The locations, angles and dimensions of the interior partitions, as well as the location and size of the vent, are then "tuned" to the characteristics of the speaker(s). A particular enclosure designed to deliver superior performance with a particular speaker may not perform well at all with another speaker of equal size, but with different characteristics. Thus, it should be understood that any specific dimensions referred to in the following descriptions of certain embodiments apply to specific speaker applications and would likely need to be adjusted for different speakers.

Figure 3:
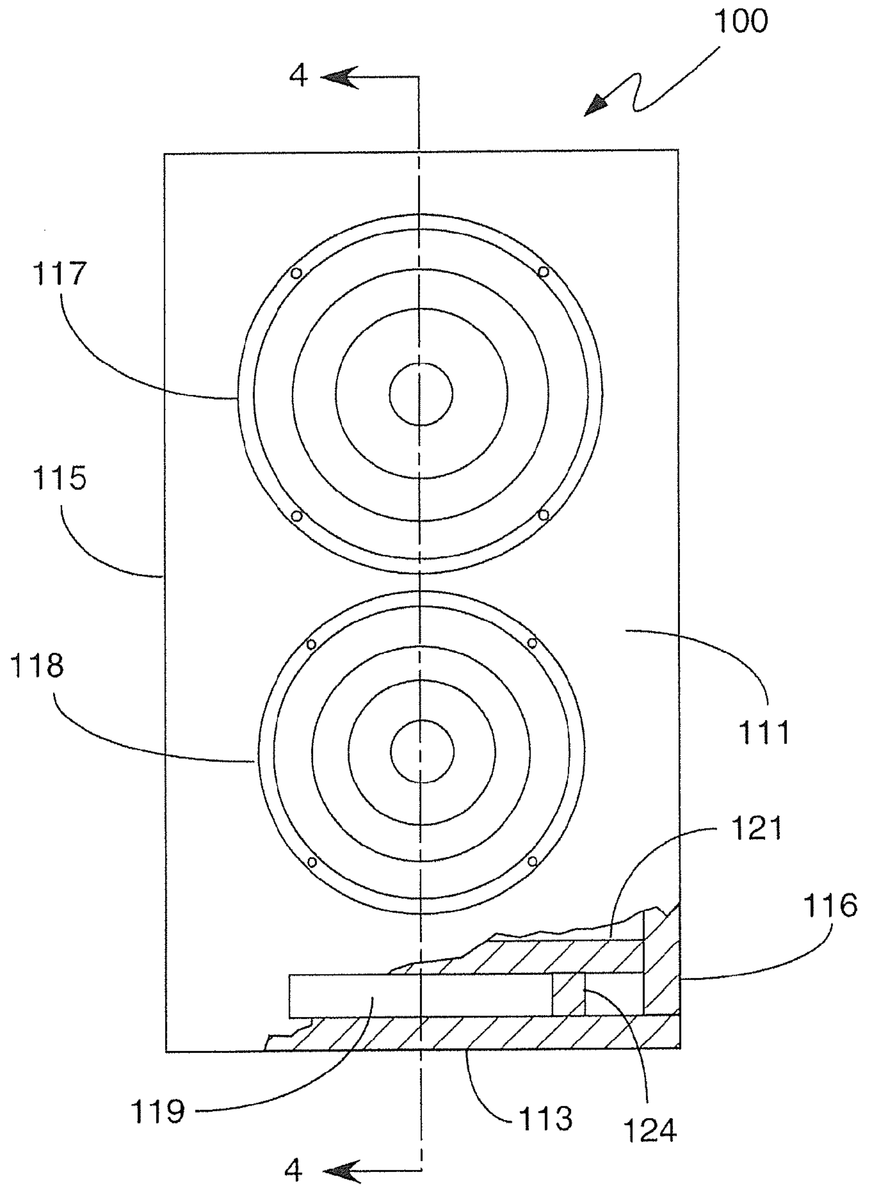
FIG. 3 is a partially cut-away front elevation view of a speaker enclosure according to an embodiment of the present invention.
Figure 4:
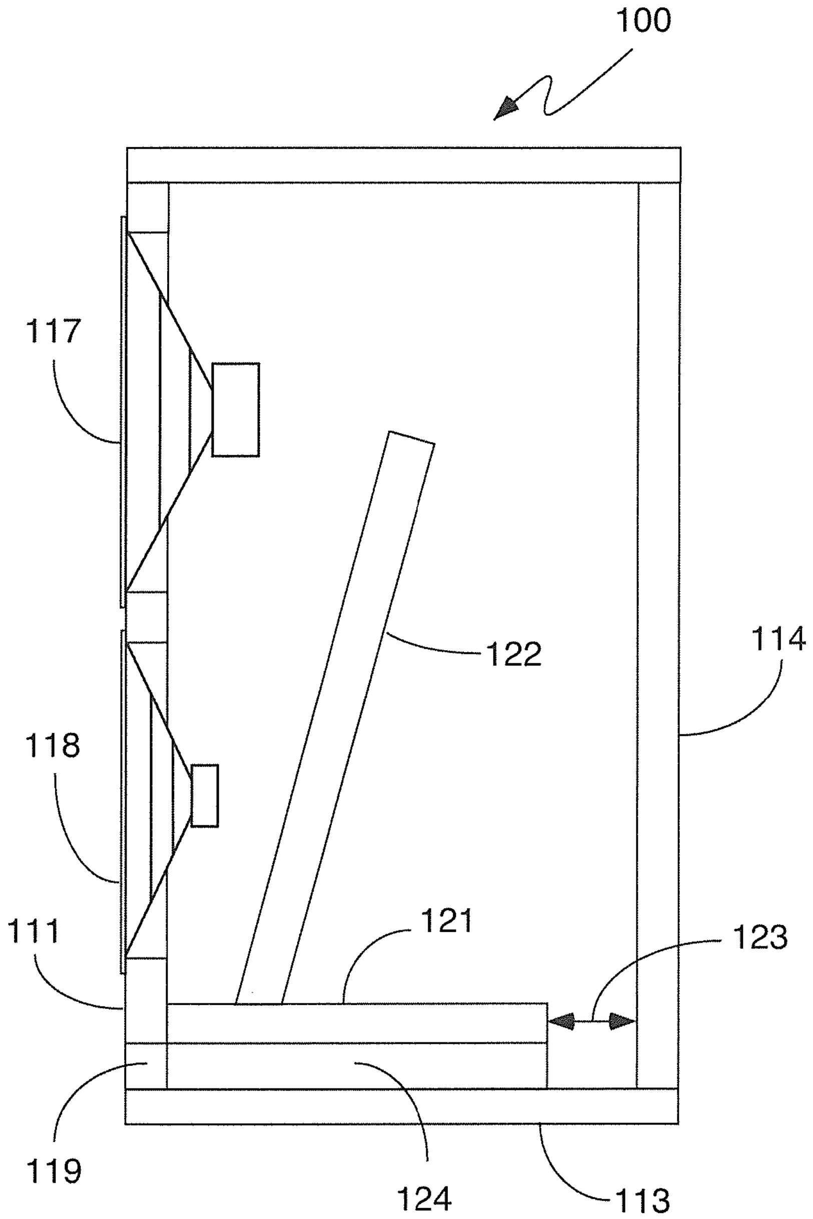
FIG. 4 is a cross-sectional view through line 4-4 of FIG. 3.

FIG. 3 is a partially cut-away front elevation view and FIG. 4 is a vertical cross-sectional view of an improved speaker enclosure 100 in accordance with an embodiment of the present invention. Enclosure 100 is similar in many respects to enclosure 10. Notably different, however, is the placement of speakers 117 and 118. Woofer 117 is mounted away from shelf portion 121 to minimize cancellation as discussed above. Tweeter 118 is mounted below woofer 117. By placing the woofer higher within the enclosure and mostly higher than the top of slanted board 122, the distance from the rear of the speaker to the nearest reflecting surface (the rear of the enclosure) is significantly increased in comparison to my earlier designs. This significantly lowers the frequency of cancellation. Acoustical filling may be inserted in the increased volume behind the woofer to effectively eliminate that frequency inside the enclosure. The result is that the listener receives that frequency directly from the front of the woofer.

Shelf portion 121 is generally horizontal and abuts front wall 111 immediately below speaker 118. Unlike the shelf portion in enclosure 10 described above, shelf portion 121 of enclosure 100 extends further rearwardly toward back wall 114, leaving gap 123. Shelf portion 121 is supported above bottom wall 113 by a pair of strips 124 that are spaced apart to establish the width of port 119. Slanted portion 122 extends upwardly from shelf portion 121 and rearwardly therefrom behind speaker 118. Both shelf portion 121 and slanted portion 122 extend the entire width of enclosure 100 between side walls 115 and 116.

Sound waves leaving the rear of woofer 117 are compressed as they enter the space between the top of slanted portion 122 and back wall 114. As the sound waves travel down, there is decompression as the volume increases between slanted portion 122 and back wall 114. The sound waves are again compressed as they enter gap 123 on the way to port 119. Reference to "compression" of the sound waves is not meant to imply that the sound waves are compressed in the sense of decreasing their wavelength, and hence increasing their frequency. Rather, it is the reciprocating air masses in which the sound waves are propagated that are cyclically compressed in the regions of decreasing cross sectional area and then decompressed in the regions of increasing cross sectional area. However, it is convenient to refer to this effect as compression/decompression of the sound waves.

The physical construction of speaker enclosure 100 is similar to that described above for enclosure 10. The walls and partitions of enclosure 100 may be constructed from medium density fiberboard (MDF), particle board, plywood or any other suitable material having acoustical properties appropriate for use in a loudspeaker enclosure generally. The individual panels are joined to one another by fasteners and/or glue, taking care that the joints are tight and will not vibrate.

In a particular embodiment, speaker enclosure 100 illustrated in FIGS. 3 and 4 may be adapted for a bookshelf speaker using an approximately 4-inch woofer. In such an embodiment, the enclosure has internal dimensions of approximately 10.5 inches high by 5 inches wide by 5 inches deep. The gap 123 is approximately 0.84 inch and the port dimensions are approximately 3.5 inches wide by 0.375 inch high.

Figure 5:
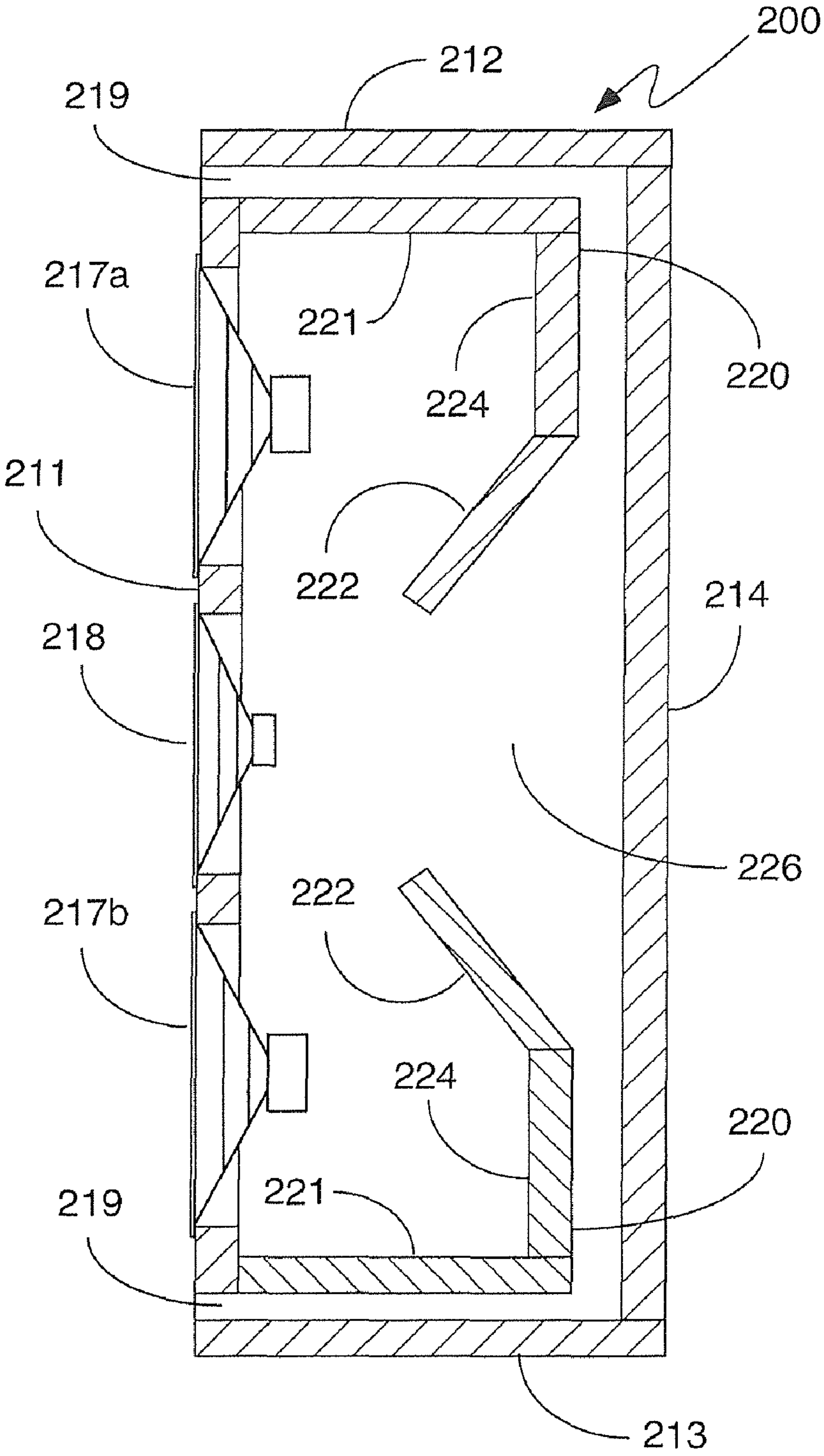
FIG. 5 is a cross-sectional view of another speaker enclosure according to an embodiment of the present invention.

FIG. 5 is a horizontal cross-sectional view of a speaker enclosure 200 in accordance with another embodiment of the present invention. Enclosure 200 is adapted for a center channel speaker with a pair of woofers 217*a*, 217*b* and a single tweeter 218. Partitions 220 each include a first portion 221 that is generally parallel to and spaced apart from the respective side wall 212, 213 and that abuts front wall 211 outboard of the respective woofer. Each of partitions 220 further includes a second portion 224 that is generally parallel to and spaced apart from back wall 214. Third portions 222 of partitions 220 extend forwardly from second portions 224 at respective angles pointing generally toward tweeter 218. All of the partition portions 221, 224 and 222 extend the entire height of enclosure 200 between the top and bottom walls. The distance behind the woofers to the respective partition portions 224 is maximized in this design. The angled portions are mostly off to the sides of the respective woofers and provide compression into the main chamber 226, shared by both woofers, where decompression occurs. There are two bass-reflex ports 219, one at the top and one at the bottom. Sound waves are compressed a final time upon entering the space between portions 224 and back wall 214 on the way to the port openings.

In a particular embodiment, speaker enclosure 200 has internal dimensions of approximately 15 inches wide by 5 inches high by 5 inches deep. Partitions are spaced apart from the side and rear walls by approximately 0.31 inch, which also defines the width of the ports.

Figure 6:
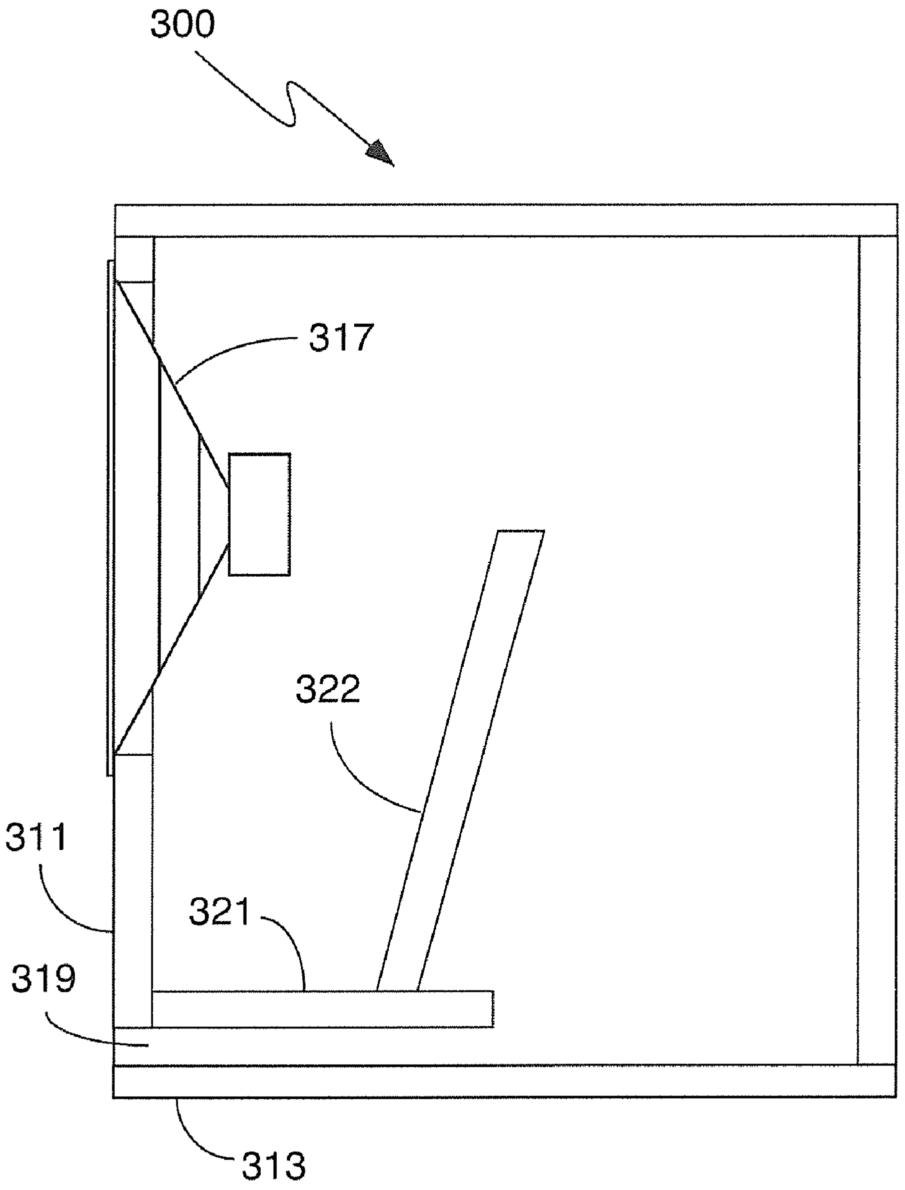
FIG. 6 is a cross-sectional view of another speaker enclosure according to an embodiment of the present invention.

FIG. 6 is a vertical cross-sectional view of a speaker enclosure 300 in accordance with another embodiment of the present invention. Enclosure 300 is adapted for a single speaker subwoofer. A shelf 321 is spaced apart from bottom wall 313 and abuts front wall 311 to define a port opening 319. Slanted partition 322 extends upwardly from shelf 321 and rearwardly therefrom behind speaker 317. Shelf 321 and slanted partition 322 extend the entire width of enclosure 300 between the side walls.

Figure 7:
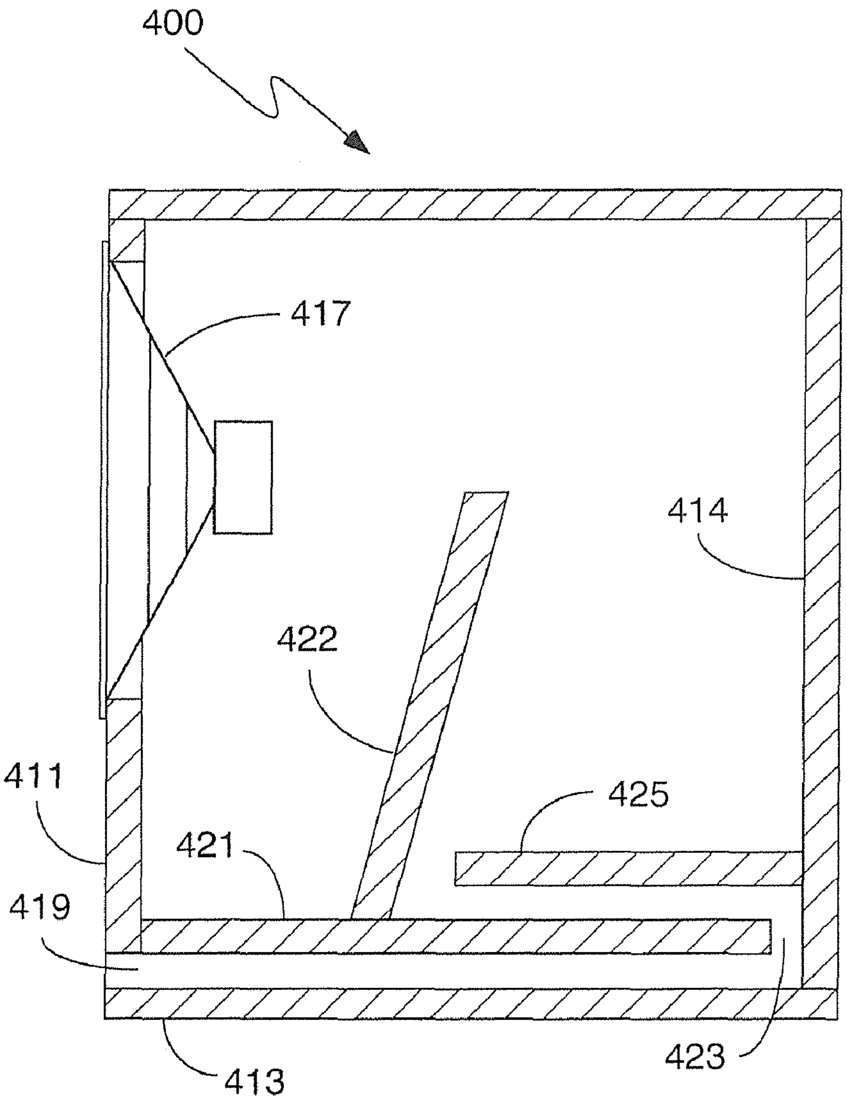
FIG. 7 is a cross-sectional view of another speaker enclosure according to an embodiment of the present invention.

FIG. 7 is a vertical cross-sectional view of a speaker enclosure 400 in accordance with another embodiment of the present invention. Enclosure 400 is adapted for a single speaker subwoofer and is similar to enclosure 300 described above. A first shelf 421 is spaced apart from bottom wall 413 and abuts front wall 411 to define a port opening 419. Here, however, shelf 421 extends further back toward back wall 414 than does shelf 321 of the previously described embodiment, terminating at gap 423. Slanted partition 422 extends upwardly from shelf 421 and rearwardly therefrom behind speaker 417. A second shelf 425 is spaced apart from shelf 421 and is disposed behind partition 422. Shelves 421 and 425 and slanted partition 422 extend the entire width of enclosure 400 between the side walls.

In a particular embodiment adapted for use with an approximately 10-inch woofer, speaker enclosure 300 has internal dimensions of approximately 15 inches high by 15 inches wide by 14 inches deep. The shelves are spaced apart from the bottom wall and from each other by approximately 0.5 inch, which is the vertical dimension of port 319.

Figure 8:
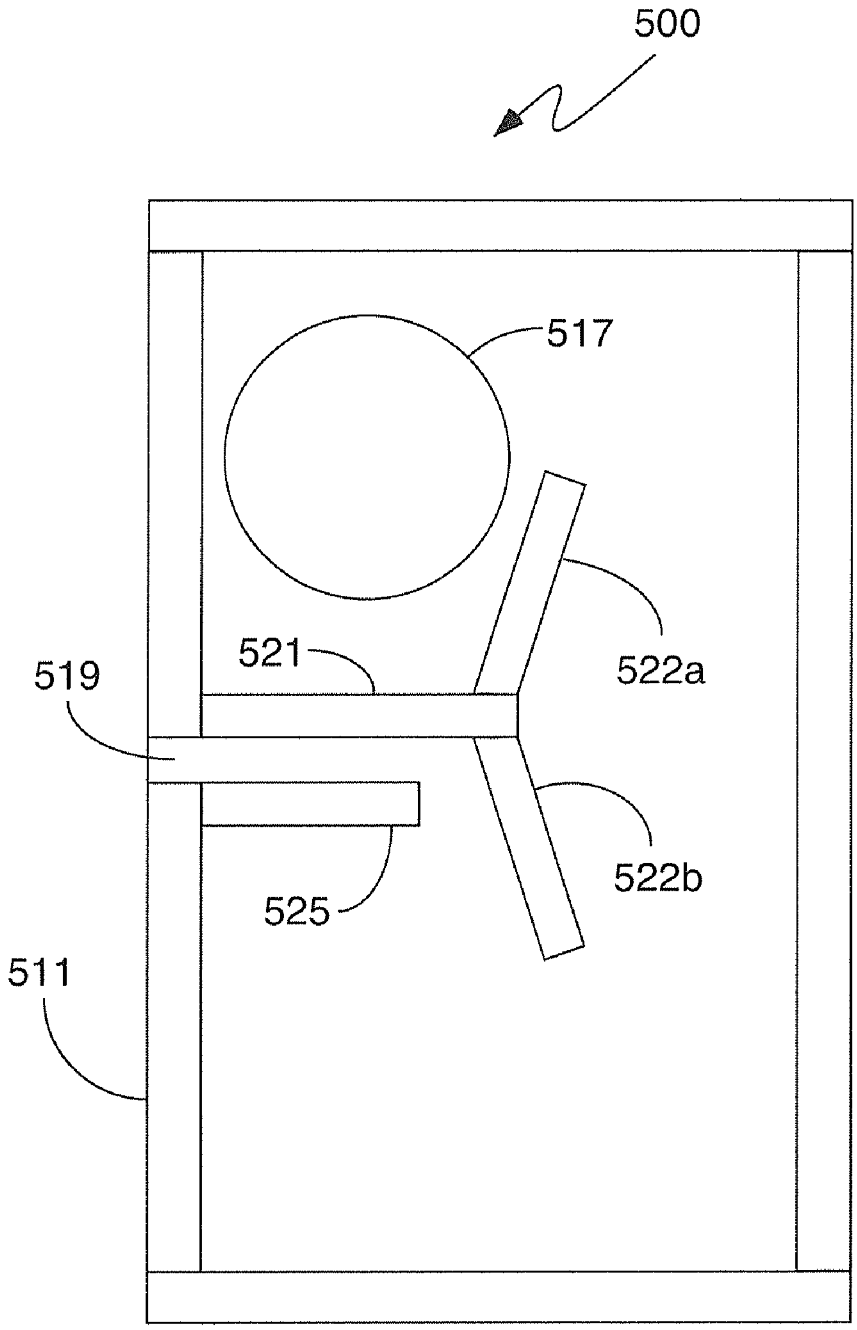
FIG. 8 is a cross-sectional view of another speaker enclosure according to an embodiment of the present invention.

FIG. 8 is a vertical cross-sectional view of a speaker enclosure 500 in accordance with another embodiment of the present invention. Enclosure 500 is adapted for a two-speaker side-firing assisted subwoofer with a speaker 517 on each side of the enclosure. A first shelf 521 is generally horizontal and abuts front wall 511 below speakers 517. A second shelf 525 also abuts front wall 511 and is spaced apart from and below shelf 521. Slanted partitions 522*a* and 522*b* extend upwardly and downwardly, respectively, from the end of shelf 521. Shelves 521 and 525 and slanted partitions 522*a* and 522*b* extend the entire width of enclosure 500 between the side walls.

In a particular embodiment adapted for use with a pair of approximately 10-inch woofers, speaker enclosure 500 has internal dimensions of approximately 30.5 inches high by 12 inches wide by 20 inches deep. Shelf 521 extends back from front wall 511 approximately 8.5 inches and shelf 525 extends back from front wall 511 approximately 6.5 inches. Partitions 522*a* and 522*b* are each approximately 6 inches in length. Shelves 521 and 525 are spaced apart by approximately 0.625 inch, which is the vertical dimension of port 519.

Figure 9:
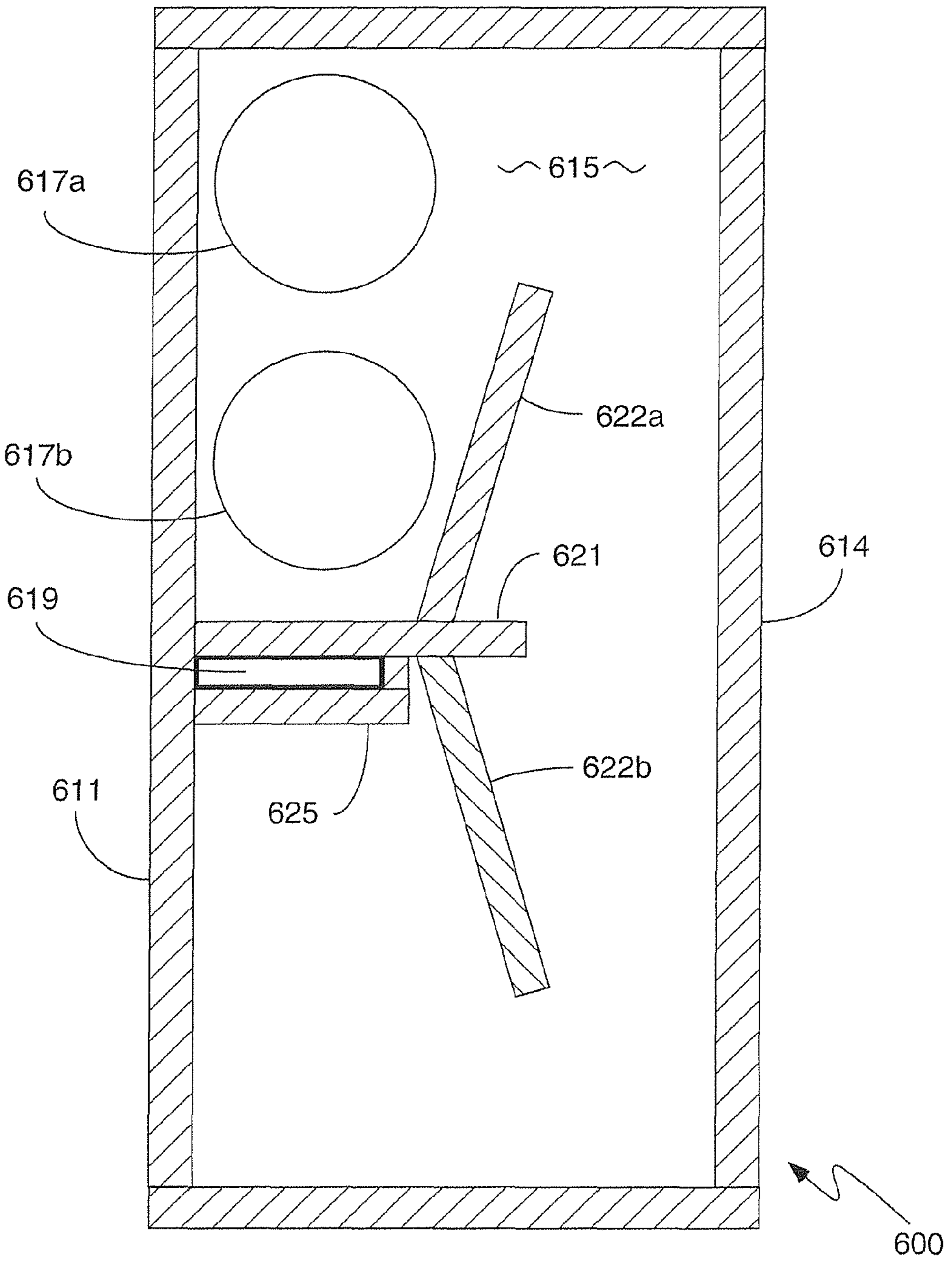
FIG. 9 is a cross-sectional view of another speaker enclosure according to an embodiment of the present invention.

FIG. 9 is a vertical cross-sectional view of a speaker enclosure 600 in accordance with another embodiment of the present invention. Enclosure 600 is adapted for a two-speaker assisted subwoofer. Subwoofers 617*a* and 617*b* are mounted in side wall 615, which also includes port 619. A first shelf 621 is generally horizontal and abuts front wall 611 below speaker 617*b*. A second shelf 625 also abuts front wall 611 and is spaced apart from and below shelf 621 to form a rectangular duct leading to port 619. Slanted partitions 622*a* and 622*b* extend upwardly and downwardly, respectively, from shelf 621. Shelf 621 and slanted partitions 622*a* and 622*b* extend the entire width of enclosure 600 between the side walls. Shelf 625 abuts side wall 615, but is spaced apart from the opposite side wall to provide an air path to the rectangular duct leading to port 619.

In a particular embodiment adapted for use with a pair of approximately 10-inch woofers, speaker enclosure 600 has internal dimensions of approximately 39 inches high by 8.5 inches wide by 22 inches deep. Shelf 621 extends back from front wall 611 approximately 10 inches to partitions 622*a* and 622*b* and approximately 2.75 inches beyond, leaving a gap of approximately 9.25 inches to rear wall 614. Shelf 625 extends back from front wall 611 approximately 9 inches. Partition 622*a* is approximately 11.5 inches in length and partition 622*b* is approximately 10 inches in length. Shelves 621 and 625 are spaced apart by approximately 0.825 inch, which is the vertical dimension of port 619.

Figure 10:
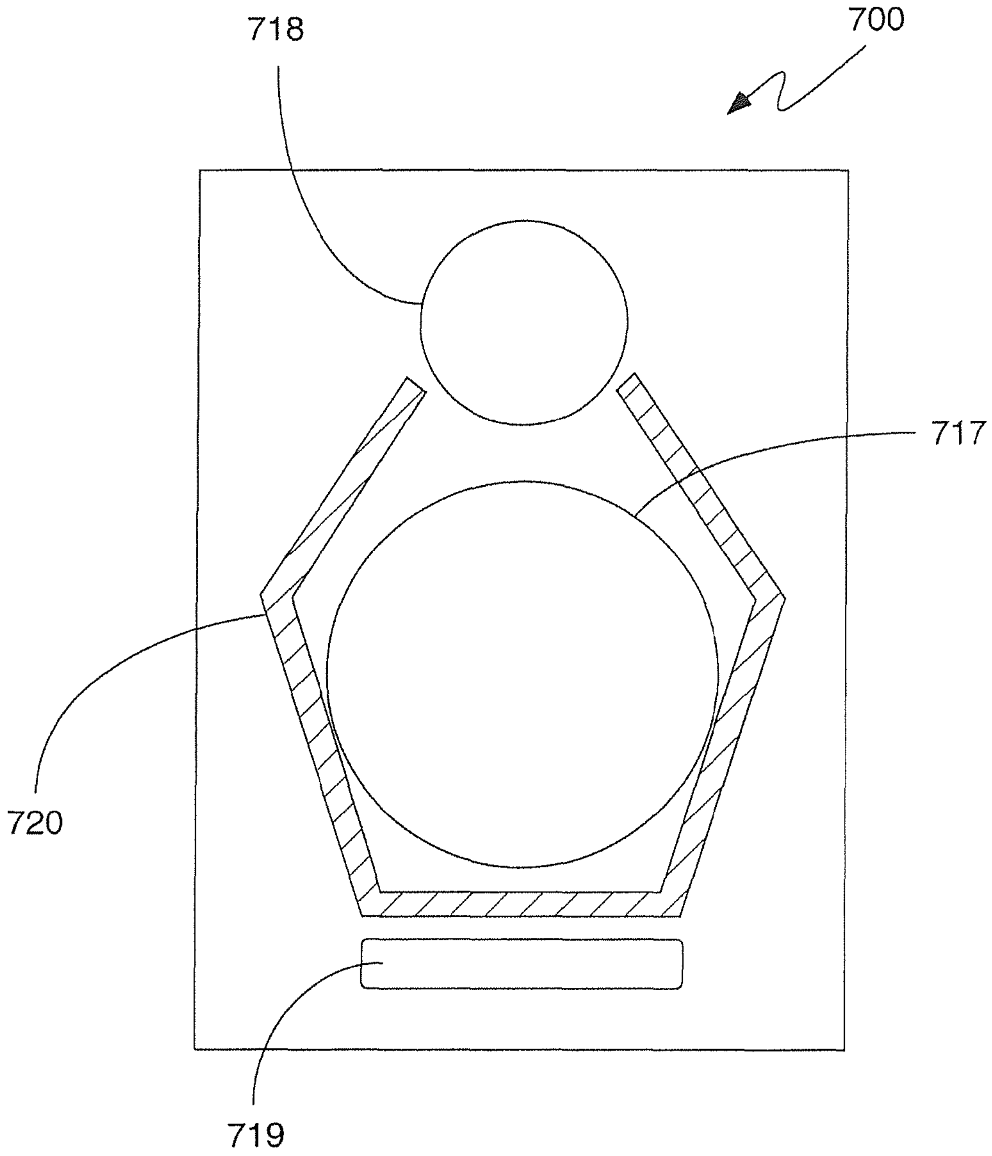
FIG. 10 is a cross-sectional view of another speaker enclosure according to an embodiment of the present invention.

FIG. 10 is a cross-sectional view through a speaker enclosure 700 in accordance with another embodiment of the present invention. Enclosure 700 is adapted for use with an in-wall speaker system, which, by its nature, is limited in depth. Woofer 717 and tweeter 718 are mounted within enclosure 700 facing outwardly to project sound waves into the room through a front grill. Due to the limited depth of the enclosure, it is not practical to provide an effective serpentine path behind the woofer as in the previously described embodiments. A partition 720 surrounds a substantial portion of woofer 717. A vent 719 is located below partition 720 so that sound waves emanating from the rear of the woofer must travel around the partition before exiting through the vent.

It will be recognized that the above-described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A loudspeaker comprising:

first and second speakers having respective front and rear surfaces for radiating low frequency sound waves;

a third speaker having a front surface, the third speaker located between the first and second speakers;

an enclosure having a front wall and a rear wall, the front wall having first, second and third apertures therethrough for receiving the first, second and third speakers, respectively;

the enclosure further having a first side wall extending between the front and rear walls proximate to the first speaker and a second side wall extending between the front and rear walls proximate to the second speaker;

a first partition within the enclosure spaced apart from the first side wall defining a first channel, the front wall of the enclosure having a first port aperture opening into the first channel;

a second partition within the enclosure adjoining the first partition and spaced apart from the rear wall, the second partition extending at least partially behind the first speaker;

a third partition within the enclosure adjoining the second partition and angled toward the front wall;

a fourth partition within the enclosure spaced apart from the second side wall defining a second channel, the front wall of the enclosure having a second port aperture opening into the second channel;

a fifth partition within the enclosure adjoining the fourth partition and spaced apart from the rear wall, the fifth partition extending at least partially behind the second speaker;

a sixth partition within the enclosure adjoining the fifth partition and angled toward the front wall.

2. The loudspeaker of claim 1 wherein the enclosure has a substantially rectangular cross-section.

3. The loudspeaker of claim 1 wherein the first and fourth partitions are substantially parallel to the first and second side walls, respectively.

4. The loudspeaker of claim 1 wherein the second and third partitions are substantially parallel to the rear wall.

5. The loudspeaker of claim 1 wherein the third and sixth partitions are angled substantially toward the third aperture.

6. The loudspeaker of claim 1 wherein the first and second side walls of the enclosure are spaced apart by approximately 15 inches.

7. The loudspeaker of claim 1 wherein the front and rear walls of the enclosure are spaced apart by approximately 5 inches.

8. The loudspeaker of claim 1 wherein the first and second side walls of the enclosure are approximately 5 inches square.

9. A loudspeaker comprising:

first and second speakers for radiating low frequency sound waves;

a third speaker;

an enclosure surrounding the first, second and third speakers;

partitions within the enclosure defining first and second chambers associated with the first and second speakers, respectively, each of the first and second chambers opening into a third chamber through respective first and second regions of decreasing cross-sectional area;

wherein the third chamber communicates with first and second port apertures in the front wall of the enclosure through respective third and fourth regions of decreasing cross-sectional area.

10. The loudspeaker of claim 9 wherein sound waves emanating from respective rear surfaces of the first and second speaker are subjected to alternating compression and decompression traveling from the rear surfaces to the first and second port apertures.

* * * * *